US012585920B2

(12) United States Patent
Kazda et al.

(10) Patent No.: US 12,585,920 B2
(45) Date of Patent: Mar. 24, 2026

(54) PREDICTING OPTIMAL PARAMETERS FOR PHYSICAL DESIGN SYNTHESIS

(71) Applicant: International Business Machines Corporation, Armonk, NY (US)

(72) Inventors: Michael Kazda, Poughkeepsie, NY (US); Michael Daniel Monkowski, New Windsor, NY (US)

(73) Assignee: International Business Machines Corporation, Armonk, NY (US)

( * ) Notice: Subject to any disclaimer, the term of this patent is extended or adjusted under 35 U.S.C. 154(b) by 573 days.

(21) Appl. No.: 18/309,438

(22) Filed: Apr. 28, 2023

(65) Prior Publication Data

US 2024/0362459 A1     Oct. 31, 2024

(51) Int. Cl.
  *G06N 3/0455*     (2023.01)
  *G06F 30/327*     (2020.01)
  *G06N 3/0895*     (2023.01)
(52) U.S. Cl.
  CPC ......... *G06N 3/0455* (2023.01); *G06F 30/327* (2020.01); *G06N 3/0895* (2023.01)
(58) Field of Classification Search
  None
  See application file for complete search history.

(56) References Cited

U.S. PATENT DOCUMENTS

| | | |
|---|---|---|
| 7,337,420 B2 | 2/2008 | Chidambarrao et al. |
| 11,354,582 B1 | 6/2022 | Prat et al. |

(Continued)

FOREIGN PATENT DOCUMENTS

| | | |
|---|---|---|
| WO | 20200112023 A1 | 6/2020 |
| WO | 20200197529 A1 | 10/2020 |

(Continued)

OTHER PUBLICATIONS

Zhu, Keren, Mingjie Liu, Yibo Lin, Biying Xu, Shaolan Li, Xiyuan Tang, Nan Sun, and David Z. Pan. "Genius Route: A new analog routing paradigm using generative neural network guidance." In 2019 IEEE/ACM International Conference on Computer-Aided Design (ICCAD), pp. 1-8. IEEE, 2019. (Year: 2019).*

(Continued)

*Primary Examiner* — Vincent Gonzales
(74) *Attorney, Agent, or Firm* — Patterson + Sheridan, LLP

(57)          ABSTRACT

Embodiments of the present disclosure provide enhanced systems and methods for predicting optimal design flow parameters for optimized output targets for physical design synthesis of a given IC design. A Variational Autoencoder (VAE) along with a regression network are trained using a dataset comprising synthesis design construction flows from historical IC designs to provide a training data representation of the dataset constrained to a latent space of the VAE. The system generates feature vectors based on the training data representation of the dataset and updates the feature vectors with initial design characteristics of the given IC design. The system iteratively performs an input gradient search of the updated feature vectors to optimize an objective function of the design targets to identify locally optimal design parameters. The system identifies globally optimal design flow parameters for optimized design targets based on locally optimal design parameters.

21 Claims, 11 Drawing Sheets

(56) References Cited

U.S. PATENT DOCUMENTS

| | | | |
|---|---|---|---|
| 11,373,096 | B2 | 6/2022 | Chidlovskii et al. |
| 11,568,961 | B2 | 1/2023 | Bucher et al. |
| 2019/0370435 | A1 | 12/2019 | Sha et al. |
| 2022/0138388 | A1 | 5/2022 | Wang et al. |
| 2022/0335286 | A1 | 10/2022 | Cummings et al. |
| 2025/0077888 | A1 | 3/2025 | Monkowski et al. |

FOREIGN PATENT DOCUMENTS

| | | | |
|---|---|---|---|
| WO | 2020251680 | A1 | 12/2020 |
| WO | 2021170735 | A1 | 9/2021 |
| WO | 2022144203 | A1 | 7/2022 |
| WO | 2024/223404 | A1 | 10/2024 |

OTHER PUBLICATIONS

Ning F, Ma Y, Yang H, Yu B, Yang H, Wang Y. Machine Learning for Electronic Design Automation: A Survey. arXiv preprint arXiv: 2102.03357. Feb. 2021. (Year: 2021).*

International Search Report and Written Opinion for International Application No. PCT/EP2024/060563 Mailed Aug. 28, 2024.

Habal, et al.: "Constraint-Based Layout-Driven Sizing of Analog Circuits", IEEE Transactions on Computer-Aided Design of Integrated Circuits and Systems, IEEE, USA, vol. 30, No. 8, Aug. 1, 2011 (Aug. 1, 2011) | pp. 1089-1102, XP011330078, ISSN: 0278-0070, DOI: 10.1109/TCAD.2011.2158732.

Fchollet, "Keras documentation: Variational AutoEncoder", Keras Teasm, URL: https://keras.io/examples/generative/vae/, Date Created: May 3, 2020, Last Modified: May 3, 2020, Printed: May 8, 2023, 6 pages.

Garciarena et al., "Expanding variational autoencoders for learning and exploiting latent representations in search distributions", ACM, GECCO '18: Proceedings of the Genetic and Evolutionary Computation Conference, https://doi.org/10.1145/3205455.3205645, dated Jul. 2018, 8 pages.

Huang et al., "A Dimension-Reduced Artificial Neural Network for the Compact Modeling of Semiconductor Devices", Conference: 2018 IEEE MTT-S International Wireless Symposium (IWS), DOI:10.1109/IEEE-IWS.2018.8400840, dated May 2018, 4 pages.

Kazda et al., "Recommending Design Flow Parameters Using a Variational Autoencoder", URL: https://arxiv.org/pdf/1802.05814, 2022, Woodstock '18: ACM Symposium on Neural Gaze Detection, Jun. 3-5, 2018, Woodstock, NY. AC, New York, NY, 4 pages.

Keren Zhu, "Fully-Automated Layout Synthesis for Analog and Mixed-Signal Integrated Circuits", Dissertation, Electrical and Computer Engineering, The University of Texas at Austin, dated Aug. 2022, 70 pages.

Lee et al., "Layout-induced stress effects on the performance and variation of FinFETs", 2015 International Conference on Simulation of Semiconductor Processes and Devices (SISPAD), DOI: 10.1109/SISPAD.2015.7292336, Date Added to IEEE Xplore: Oct. 8, 2015, 4 pages.

Lin et al., "High Performance 14nm SOI FinFET CMOS Technology with 0.0174 μm2 embedded DRAM and 15 Levels of Cu Metallization", 2014 IEEE International Electron Devices Meeting, DOI: 10.1109/IEDM.2014.7046977, Date Added to IEEE Xplore: Feb. 23, 2015, 3 pages.

Mun et al., "14nm FinFET Technology SRAM Cell Margin Evaluation and Analysis by Local Layout Effect", Conference: 2017 IEEE SOI-3D-Subthreshold Microelectronics Technology Unified Conference (S3S), DOI:10.1109/S3S.2017.8309248, Oct. 2017, 2 pages.

Samsung, "Samsung Exynos Processor", Samsung Semiconductor Global, URL: https://semiconductor.samsung.com/processor/, 2023, printed: May 8, 2023, 6 pages.

Samsung, FinFET Process, "Radical Innovation to Push the Limit for Greater Speed and Efficiency", Samsung Exynos, URL: http://etest.ninefive.org/index.html, 2017, printed Mar. 29, 2023, 4 pages.

Sourodeep Bhattacharjee, "Variational Autoencoder Based Estimation Of Distribution Algorithms And Applications To Individual Based Ecosystem Modeling Using EcoSim", University of Windsor, Electronic Theses and Dissertations, https://scholar.uwindsor.ca/etd/7687 , Jun. 2019, 201 pages.

Touloupas et al., "Mixed-Variable Bayesian Optimization for Analog Circuit Sizing using Veriational Autoencoders", 2022 18th International Conference on Synthesis, Modeling, Analysis and Simulation Methods and Applications to Circuit Design (SMACD), DOI: 10.1109/SMACD55068.2022.9816185, Downloaded on Mar. 10, 2023, 4 pages.

Tsutsui et al., "SiGe FinFET for Practical Logic Libraries by Mitigating Local Layout Effect", 2017 Symposium on VLSI Technology Digest of Technical Papers, DOI: 10.23919/VLSIT.2017.7998215, Date Added to IEEE Xplore: Aug. 3, 2017, 2 pages.

Van Cleef et al., "BonnCell: Automatic Cell Layout in the 7-nm era", IEEE Transactions on Computer-Aided Design of Integrated Circuits and Systems, vol. 39, No. 10, dated Oct. 2020, 14 pages.

Wen et al., "Fin Bending Mitigation and Local Layout Effect Alleviation in Advanced FinFET Technology through Material Engineering and Metrology Optimization", 2019 Symposium on VLSI Technology, DOI: 10.23919/VLSIT.2019.8776517, 2019 Symposium on VLSI Technology Digest of Technical Papers, Published Jun. 1, 2019, 2 pages.

Yang et al., "10nm High Performance Mobile SoC Design and Technology Co-Developed for Performance, Power, and Area Scaling", 2017 Symposium on VLSI Technology Digest of Technical Papers, DOI: 10.23919/VLSIT.2017.7998203, Jun. 2017, 2 pages.

Zhang et al., "Local Layout Effect Impact to Single Device in Sram 6T Cell," 2019 China Semiconductor Technology International Conference (CSTIC), DOI: 10.1109/CSTIC.2019.8755621, Date Added to IEEE Xplore: Jul. 8, 2019, 4 pages.

Zhao et al., "Influence of stress induced CT local layout effect (LLE) on 14nm FinFET", 2017 Symposium on VLSI Technology Digest of Technical Papers, DOI:10.23919/VLSIT.2017.7998182, Published Jun. 1, 2017, 2 pages.

Zwerdling et al., "Understanding the Properties if Generated Corpora", IBM Research, arXivL2206.11219v2 [cs.CL], https://doi.org/10.48550/arXiv.2206.11219, dated Oct. 27, 2022, 7 pages.

Agnesina, Anthony, Kyungwook Chang, and Sung Kyu Lim. "VLSI placement parameter optimization using deep reinforcement learning." Proceedings of the 39th International Conference on Computer-Aided Design. 2020. pp. 1-9.

Clement Chadebec et al., "Data Augmentation in High Dimensional Low Sample Size Setting Using a Geometry-Based Variational Autoencoder," arXiv, Dated: Apr. 30, 2021, pp. 1-25.

F. Chollet, "Variational AutoEncoder," Keras, Dated: May 3, 2020, pp. 1-6.

Geng, Hao, et al. "Techniques for CAD tool parameter auto-tuning in physical synthesis: a survey." 2022 27th Asia and South Pacific Design Automation Conference (ASP-DAC). IEEE, 2022. pp. 1-6.

Huang, Wenbing, et al. "Scalable Gaussian process regression using deep neural networks." Twenty-fourth international joint conference on artificial intelligence. 2015. pp. 1-7.

D. Kingma et al., "Auto-Encoding Variational Bayes," arXiv.org, Dated: May 1, 2014, pp. 1-14.

Kingma, Durk P., et al. "Semi-supervised learning with deep generative models." Advances in neural information processing systems 27 (2014). pp. 1-9.

Kwon, Jihye, Matthew M. Ziegler, and Luca P. Carloni. "A learning-based recommender system for autotuning design flows of industrial high-performance processors." Proceedings of the 56th Annual Design Automation Conference 2019. 2019. pp. 1-6.

Alon Oring et al., "Autoencoder Image Interpolation by Shaping the Latent Space," arXiv.org, Dated: Oct. 22, 2020, pp. 1-21.

S. Khan et al., "Adversarial Training of Variational Auto-encoders for High Fidelity Image Generation," arXiv.org, Dated: Apr. 27, 2018, pp. 1-9.

Safir, Nathan Samuel. Variational Autoencoders For Semi-Supervised Deep Metric Learning. Diss. University of Georgia, 2022. pp. 1-9.

Steven Flores, "Variational Autoencoders are Beautiful," Blogs, Dated: Apr. 15, 2019, pp. 1-10.

Y. Takida et al., "Preventing Posterior Collapse Induced by Oversmoothing in Gaussian VAE," arXiv.org, Dated: Feb. 17, 2021, pp. 1-21.

(56) References Cited

OTHER PUBLICATIONS

Z. Xie et al., "Fist: A Feature-Importance Sampling and Tree-Based Method for Automatic Design Flow Parameter Tuning," arXiv.org, Dated: Nov. 26, 2020, pp. 1-7.

Yoo, YoungJoon, et al. "Variational autoencoded regression: high dimensional regression of visual data on complex manifold." Proceedings of the IEEE Conference on Computer Vision and Pattern Recognition. 2017. pp. 1-10.

Shen Zhang et al., "Semi-Supervised Learning of Bearing Anomaly Detection via Deep Variational Autoencoders," arXiv.org, Dated: Dec. 9, 2019, pp. 1-11.

Qingyu Zhao et al., "Variational AutoEncoder for Regression: Application to Brain Aging Analysis," arXiv.org, Dated: Jul. 11, 2019, pp. 1-9.

Ziegler, Matthew M., Hung-Yi Liu, and Luca P. Carloni. "Scalable auto-tuning of synthesis parameters for optimizing high-performance processors." Proceedings of the 2016 International Symposium on Low Power Electronics and Design. 2016. pp. 1-6.

* cited by examiner

100

Figure 2:
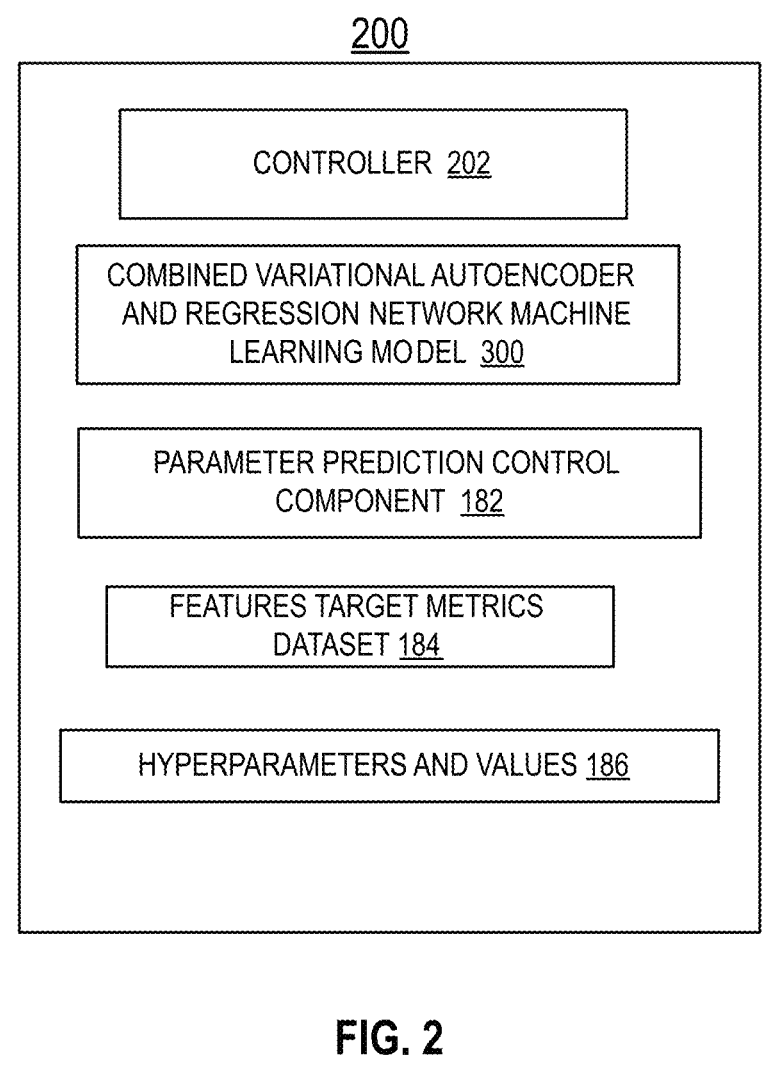

200

CONTROLLER 202

COMBINED VARIATIONAL AUTOENCODER
AND REGRESSION NETWORK MACHINE
LEARNING MODEL 300

PARAMETER PREDICTION CONTROL
COMPONENT 182

FEATURES TARGET METRICS
DATASET 184

HYPERPARAMETERS AND VALUES 186

Figure 4:
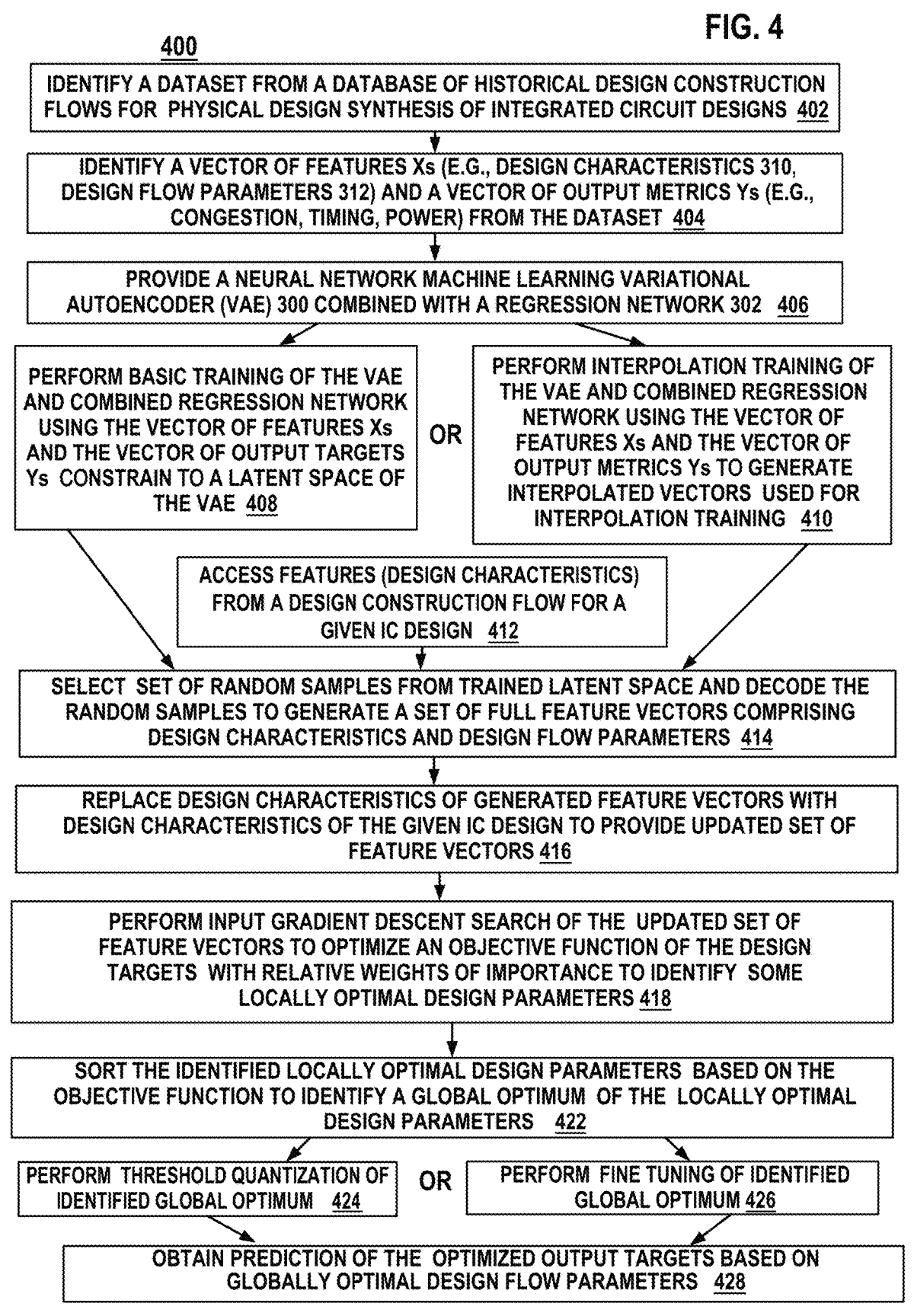

IDENTIFY A DATASET FROM A DATABASE OF HISTORICAL DESIGN CONSTRUCTION FLOWS FOR PHYSICAL DESIGN SYNTHESIS OF INTEGRATED CIRCUIT DESIGNS 402

IDENTIFY A VECTOR OF FEATURES Xs (E.G., DESIGN CHARACTERISTICS 310, DESIGN FLOW PARAMETERS 312) AND A VECTOR OF OUTPUT METRICS Ys (E.G., CONGESTION, TIMING, POWER) FROM THE DATASET 404

PROVIDE A NEURAL NETWORK MACHINE LEARNING VARIATIONAL AUTOENCODER (VAE) 300 COMBINED WITH A REGRESSION NETWORK 302 406

PERFORM BASIC TRAINING OF THE VAE AND COMBINED REGRESSION NETWORK USING THE VECTOR OF FEATURES Xs AND THE VECTOR OF OUTPUT TARGETS Ys CONSTRAIN TO A LATENT SPACE OF THE VAE 408

OR

PERFORM INTERPOLATION TRAINING OF THE VAE AND COMBINED REGRESSION NETWORK USING THE VECTOR OF FEATURES Xs AND THE VECTOR OF OUTPUT METRICS Ys TO GENERATE INTERPOLATED VECTORS USED FOR INTERPOLATION TRAINING 410

ACCESS FEATURES (DESIGN CHARACTERISTICS) FROM A DESIGN CONSTRUCTION FLOW FOR A GIVEN IC DESIGN 412

SELECT SET OF RANDOM SAMPLES FROM TRAINED LATENT SPACE AND DECODE THE RANDOM SAMPLES TO GENERATE A SET OF FULL FEATURE VECTORS COMPRISING DESIGN CHARACTERISTICS AND DESIGN FLOW PARAMETERS 414

REPLACE DESIGN CHARACTERISTICS OF GENERATED FEATURE VECTORS WITH DESIGN CHARACTERISTICS OF THE GIVEN IC DESIGN TO PROVIDE UPDATED SET OF FEATURE VECTORS 416

PERFORM INPUT GRADIENT DESCENT SEARCH OF THE UPDATED SET OF FEATURE VECTORS TO OPTIMIZE AN OBJECTIVE FUNCTION OF THE DESIGN TARGETS WITH RELATIVE WEIGHTS OF IMPORTANCE TO IDENTIFY SOME LOCALLY OPTIMAL DESIGN PARAMETERS 418

SORT THE IDENTIFIED LOCALLY OPTIMAL DESIGN PARAMETERS BASED ON THE OBJECTIVE FUNCTION TO IDENTIFY A GLOBAL OPTIMUM OF THE LOCALLY OPTIMAL DESIGN PARAMETERS 422

PERFORM THRESHOLD QUANTIZATION OF IDENTIFIED GLOBAL OPTIMUM 424

OR

PERFORM FINE TUNING OF IDENTIFIED GLOBAL OPTIMUM 426

OBTAIN PREDICTION OF THE OPTIMIZED OUTPUT TARGETS BASED ON GLOBALLY OPTIMAL DESIGN FLOW PARAMETERS 428

PREDICTING OPTIMAL PARAMETERS FOR PHYSICAL DESIGN SYNTHESIS

BACKGROUND

The present invention relates to electronic design automation (EDA) of integrated circuit (IC) designs, and more specifically, to prediction of optimal design flow parameters for power, congestion, and timing for physical design synthesis of IC designs.

Industrial digital implementation construction flows contain thousands of parameters to control algorithms to optimize circuits. Producing an optimal set of design parameters based on given design characteristics presents a significant challenge to provide optimal power, performance, and area at the end of the construction flow with a legally placed and routable design. Currently predicting optimal design flow parameters generally is a nondeterministic polynomial-time (NP)-complete problem, or a computational problem for which no efficient solution algorithm has been found.

Parameters for use in EDA physical design synthesis of IC designs are determined using various techniques and algorithms and often include trial and error processing. One technique to determine design flow parameters for physical design synthesis includes running many synthesis construction jobs with differing parameter values, collecting metrics on the result of the combinations of parameters, and producing a recommendation of parameters. Resource cost of this technique is exceptionally high, consuming significant runtime and processing power, requiring execution of the design on many machines while this technique is bounded by the runtime of the construction flow.

A need exists for new techniques to effectively and efficiently implement prediction of optimal design flow parameters; such as for optimizing power, congestion, and timing targets for physical design synthesis of an IC design; reducing runtime; and overcoming some deficiencies of traditional parameter prediction systems.

SUMMARY

Embodiments of the present disclosure provide systems and methods for predicting optimal design flow parameters for optimized output targets for physical design synthesis of integrated circuit (IC) designs. The disclosed systems and methods enable prediction of optimal design flow parameters for optimized output targets for the physical design synthesis with enhanced runtime performance. The optimized output targets can comprise power, congestion, and timing output targets.

A non-limiting disclosed method comprises receiving initial design characteristics, design flow parameters, and design targets from a design construction flow for a given integrated circuit (IC) design. The system receives a historical dataset comprising synthesis design construction flows from historical IC designs. The system trains a Variational Autoencoder (VAE) along with a regression network using the historical dataset to provide a training data representation of the dataset constrained to a latent space of the VAE. The system generates feature vectors based on the training data representation of the dataset and updates the feature vectors with the initial design characteristics. The system iteratively performs an input gradient search of the updated feature vectors to optimize an objective function of the design targets to identify locally optimal design parameters, where the updated feature vectors are constrained to the initial design characteristics. The system obtains the prediction of global optimal design flow parameters based on the identified locally optimal design parameters for optimized design targets.

This method efficiently and effectively obtains the prediction of optimal design flow parameters for optimized design targets offline with the trained VAE and regression network. This method effectively eliminates on-line running of multiple synthesis design construction flows on many machines to determine design flow parameters as performed by traditional parameter prediction systems.

Another non-limiting disclosed method, the system performs interpolation training of the VAE along with the regression network to smooth training data points constrained in the latent space and minimize a reconstruction error to enable more accurate parameter predictions. The system performs interpolation training of the VAE along with the regression network generating interpolated vectors of the dataset, and combining the interpolated vectors with training vectors to produce an augmented dataset each epoch.

Another non-limiting disclosed method, the system selects and decodes a random set of samples from the training data representation of the dataset to generate feature vectors comprising design characteristics and design flow parameters. The system replaces the design characteristics of the generated feature vectors with the initial design characteristics from the design construction flow for the given design to update the generated feature vectors. The system iteratively performs an input gradient search of the updated generated feature vectors to optimize an objective function of the design targets to identify the locally optimal design parameters.

Other disclosed embodiments include a computer system and computer program product for predicting optimal design flow parameters for optimal design targets for physical design synthesis of an IC design, implementing features of the above-disclosed methods.

BRIEF DESCRIPTION OF THE DRAWINGS

FIG. 2 is a block diagram of an example system for implementing prediction of optimal design flow parameters for physical design synthesis of one or more disclosed embodiments;

FIG. 4 provides a flow chart of example operations of an example method for implementing prediction of optimal design flow parameters of optimal design targets for physical design synthesis of one or more disclosed embodiments;

DETAILED DESCRIPTION

Figure 1:
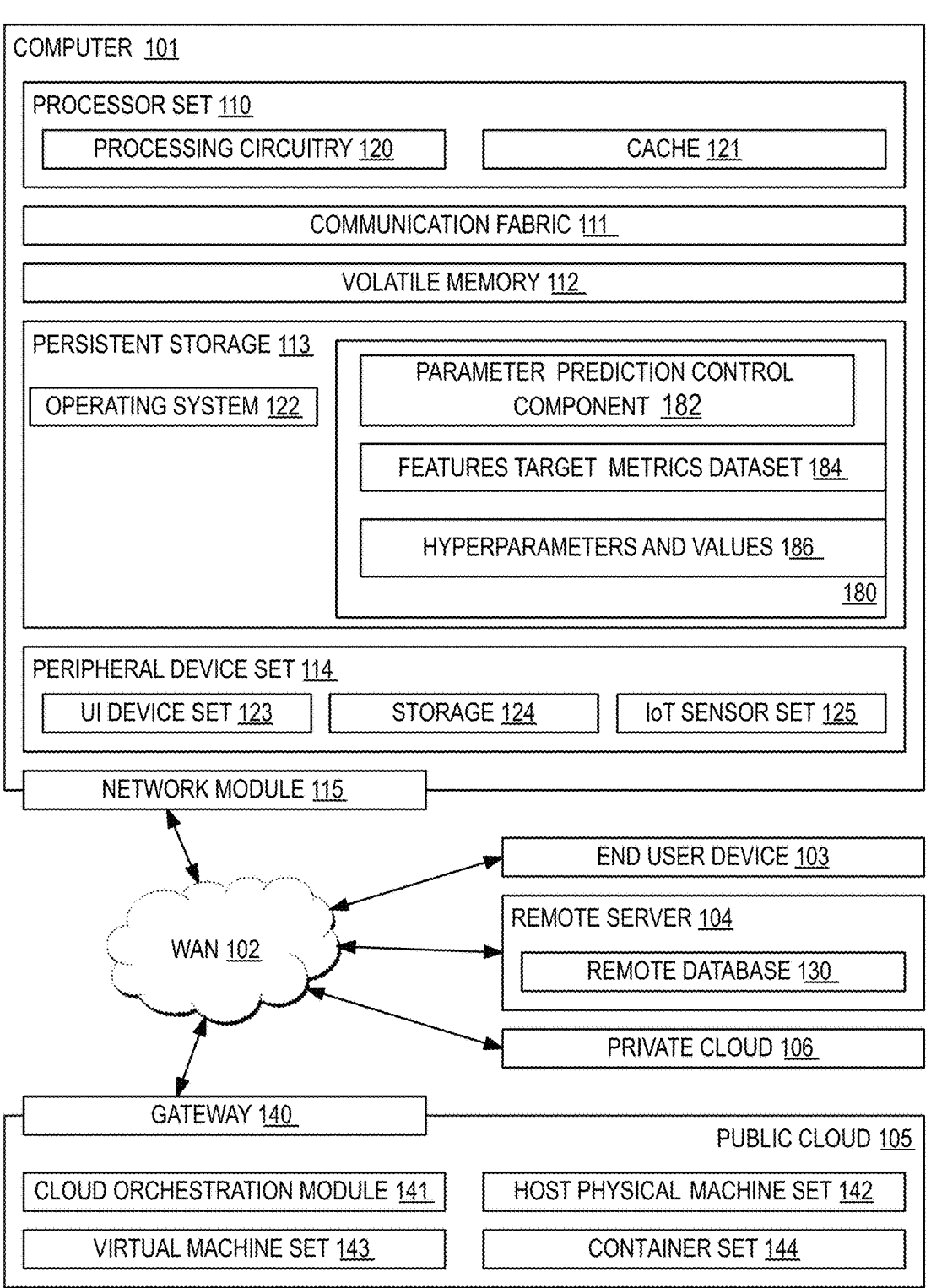
FIG. 1 is a block diagram of an example computer environment for use in conjunction with one or more disclosed embodiments for implementing prediction of optimal design flow parameters for optimized output targets for physical design synthesis of an IC design.

Problems of existing parameter prediction systems include inherent limitations of running many synthesis construction jobs, collecting metrics on the result of combinations of parameters, and producing a recommendation of parameters and the significantly large time consumed for runtime of the synthesis construction jobs. Embodiments of the present disclosure provide effective and efficient techniques for implementing the prediction of optimal design flow parameters for optimized output targets for physical design synthesis of an IC design. The disclosed systems and methods can perform the prediction of optimal design flow parameters for optimized output targets yielding significant speedup over traditional parameter identification arrangements and reducing the computing resources required.

In one embodiment, a disclosed system uses an offline machine learning neural network model comprising a Variational Autoencoder (VAE) to provide dimensionality reduction combined with a regression network to generate the prediction of optimal design flow parameters for optimized output targets for physical design synthesis of a given integrated circuit (IC) design. By combining the VAE with the regression network, the system is trained to model those features that influence the regression while at the same time obtaining the benefits of a VAE, which include the construction of a constrained latent space and a generalization of the input features. Because the latent space is centered around the origin, we can use the radius of a point in latent space to compare to the radii of our training points in latent space to determine whether we are in-domain or out-of-domain of our training. Neural networks cannot extrapolate, and neural networks can only interpolate where they have been trained, so if interpolation is attempted in latent space that has not been trained, an unreliable prediction results. If a simple autoencoder is used to reduce the dimensionality, it cannot be easily determined whether the data points are in a part of latent space that has been trained because the data points could be mapped anywhere. A VAE, on the other hand, constrains the latent space, so that all of the data points map near each other in latent space.

In one embodiment, a system receives a historical dataset, which comprises features and metrics from synthesis design construction flows from historical IC designs. The target metrics can include selected design targets used at the end of the design construction flow to recognize and optimize targets such as congestion, timing, and power. For example, the target labels and metrics may include target names and values such as congestion (weighted average congestion estimate), timing (sum of the latch-to-latch negative slacks), and total power (sum of the leakage power and dynamic power). The system performs training of the VAE along with the regression network using the historical dataset to provide a training data representation of the dataset constrained to a latent space of the VAE.

In one embodiment, a disclosed system performs interpolation training to smooth training data points in the latent space and minimize the reconstruction error for interpolated values to enable more accurate parameter predictions. The system can interpolate sampled points from the machine learned latent space representation of the dataset.

In one embodiment, the system generates feature vectors based on the training data representation of the dataset and updates the feature vectors with the initial design characteristics. The system iteratively performs an input gradient search of the updated feature vectors to optimize an objective function of the design targets to identify locally optimal design parameters, where the updated feature vectors are constrained to the initial design characteristics of the given IC design. The prediction of global optimal design flow parameters is based on the identified locally optimal design parameters for optimized design targets, such as congestion, timing, and power output targets. The system sorts the local optima constrained latent space samples based on selected contributions to the objective function and selects an optimal latent point of the constrained samples to use for prediction. During optimization, the radius of each point in latent space is computed in terms of the standard deviation for each dimension. Collapsed dimensions are treated as if they have a standard deviation of one. A loss function is added equal to the square of the radius, which is called wander. This encourages the gradient search to stay in the latent space covered by the training data. The system obtains the prediction of optimal design flow parameters for optimal power, congestion, and timing targets based on the selected optimal latent point. This method effectively implements the prediction of optimized design flow parameters using offline machine learning and the trained latent space, without on-line running of multiple synthesis design construction flows on many machines as performed by traditional parameter prediction systems.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Referring to FIG. 1, a computing environment 100 contains an example of an environment for the execution of at least some of the computer code involved in performing the inventive methods, such as a Parameter Prediction Control Component 182, a Features Target Metrics Dataset 184, and Hyper-parameters and Values 186 at block 180. In addition to block 180, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 180, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 180 in persistent storage 113.

COMMUNICATION FABRIC 111 is the signal conduction path that allows the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 180 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments.

Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Embodiments of the disclosure provide systems and methods for implementing the prediction of design flow parameters for optimized output targets for physical design synthesis of an IC design avoiding the generally extreme runtime of traditional parameter prediction arrangements. In a disclosed embodiment, a system receives initial design characteristics, design flow parameters, and design targets to be optimized for a physical design synthesis construction flow for a given IC design. The system uses a machine learning neural network model comprising a Variational Autoencoder (VAE) to provide dimensionality reduction combined with a regression model to predict optimal design flow parameters for optimal design targets for the given IC design. The system uses a dataset of design characteristics, design parameters and target metrics extracted from a database of historical synthesis design construction flows for basic training the VAE and combined regression network together. The VAE and combined regression network generate predictions of optimal design flow parameters for optimal design targets, such as optimal power, congestion, and timing targets for the physical design synthesis construction flow for the given IC design.

Figure 3:
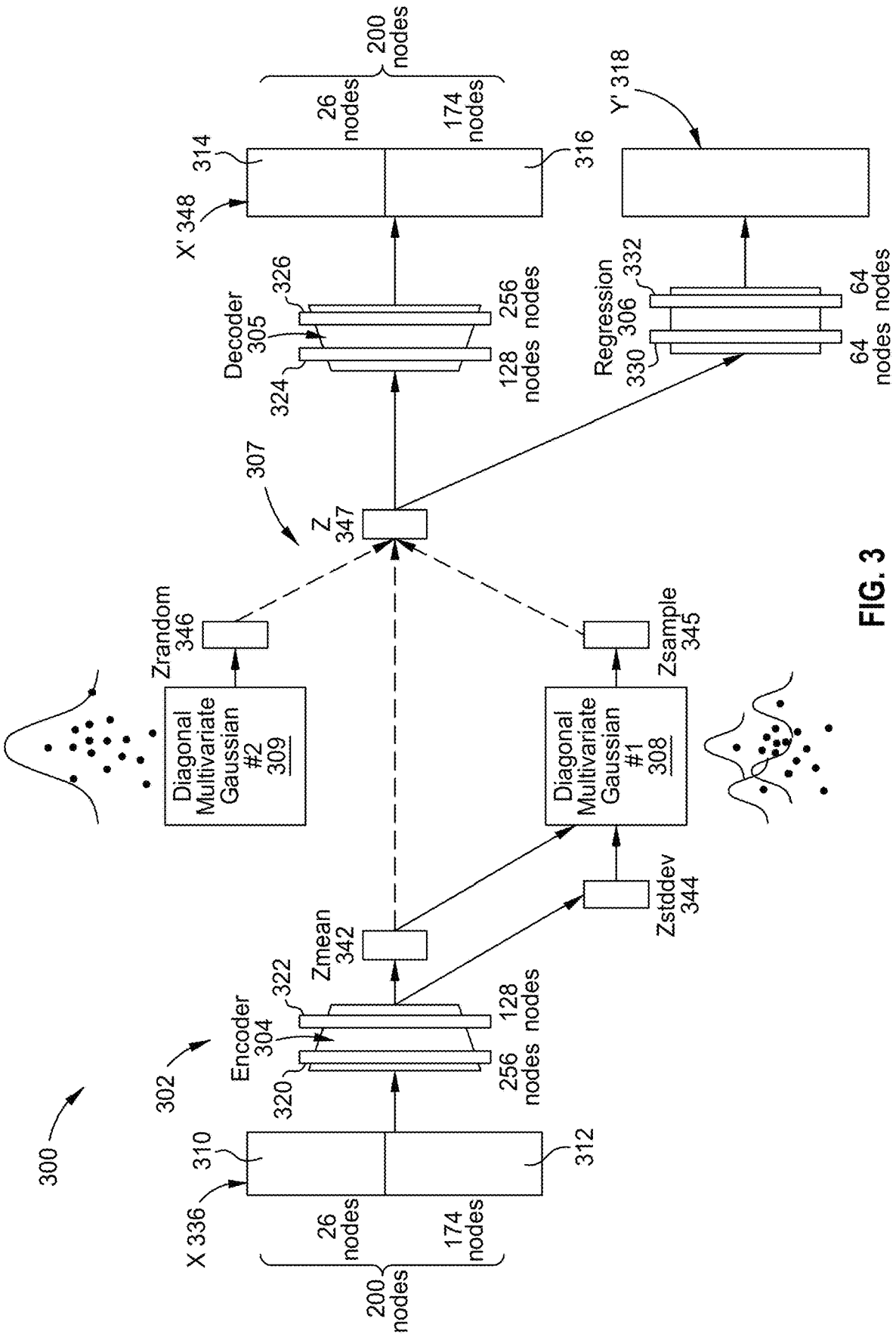
FIG. 3 is a schematic and block diagram of an example Variational Autoencoder (VAE) combined with a regression network model of the system of FIG. 2 of one or more disclosed embodiments.

FIG. 2 illustrates an example system 200 for implementing enhanced parameter prediction of one or more disclosed embodiments. System 200 uses a machine learning neural network model 300 comprising a Variational Autoencoder (VAE) combined with a regression network model, such as illustrated in FIG. 3 for implementing the enhanced parameter prediction.

System 200 can efficiently and effectively implement the prediction of optimal design flow parameters using offline machine learning with machine learning neural network model 300, avoiding on-line running of multiple synthesis design construction flows on many machines as performed by traditional parameter prediction systems.

System 200 includes a controller 202 and a Parameter Prediction Control Component 182, for example with the processor computer 101 in FIG. 1, for controlling operations of the machine learning neural network model 300 for implementing prediction of optimal design flow parameters. In a disclosed embodiment, system 200 includes a Features Target Metrics Dataset 184, and Hyper-parameters and Values 186, used with the controller 202 and processor computer 101 to implement enhanced prediction of optimal design flow (physical synthesis) parameters for optimized congestion, timing, and power targets of disclosed embodiments.

System 200 uses the Features Target Metrics Dataset 184, which comprises design characteristics features, design parameters features and target metrics from historical synthesis design construction flow files, for training the machine learning neural network model 300. System 200 receives initial design characteristics, design flow parameters, and design targets to be optimized for a design construction flow for a given IC design. The design targets to be optimized include selected design target outputs such as congestion, timing, and power. In one embodiment, system 200 uses the Hyper-parameters and Values 186, for example weights for regression, reconstruction, and regularization of the machine learning neural network model 300.

Referring also to FIG. 3, an illustrated example structure of the offline machine learning neural network model 300 comprises a Variational Autoencoder (VAE) 302 to provide dimensionality reduction combined with a regression network 306 of disclosed embodiments. The VAE 302 and combined regression network 306 predict optimal design flow parameters for optimal design targets (e.g., congestion, timing, and power targets) for synthesis construction of given integrated circuit of disclosed embodiments Example data flow operations of the VAE 302 with the combined regression network 306 are illustrated and described with respect to FIGS. 6-11.

In a disclosed embodiment, the VAE 302 provides dimensionality reduction, constrains the latent space 307 and enables interpolation of sampled points from the machine learned latent space representation of the Features Target Metrics Dataset 184 in the latent space 307. TensorFlow and Keras layers can be used, for example to implement the VAE 302. TensorFlow is an open-sourced end-to-end platform for performing a library for multiple machine learning tasks, while Keras is a high-level neural network library that runs on top of TensorFlow. Both provide high-level Application Programming Interfaces (APIs) used for building and training models.

The VAE 302 of the machine learning neural network model 300 comprises a neural network encoder 304, a neural network decoder 305, and a latent space generally indicated by 307. The regression network 306 is used with the VAE 302 for training, inference and optimization operations of disclosed embodiments. The encoder 304, decoder 305 and latent space 307 of the VAE 302 combined with the regression network 306 of disclosed embodiments generate predictions of optimal design flow parameters for optimized output targets for a synthesis construction flow for a given IC design.

The latent space 307 of the VAE 302 implements a machine learned latent space representation of an input training Features Target Metrics Dataset 184 to the encoder 304 of the combined VAE 302 and regression network 306 of disclosed embodiments. The latent space 307 comprises for example, a random sample layer composed of multiple nodes, such as 35 nodes. Each node of the example 35 latent space nodes represents one dimension of the latent space 307. The latent space 307 can be sampled using a first Diagonal Multivariate Gaussian #1, 308 or a second Diagonal Multivariate Gaussian #2, 309. The first Diagonal Multivariate Gaussian #1, 308 is used for basic training and interpolation training of the VAE 302 with the combined regression network 306 of disclosed embodiments. Using the Features Target Metrics Dataset 184, the neural network learns means, Zmean 342, and standard deviations, Zstddev 344, corresponding to each point in latent space 307, which are used by the Diagonal Multivariate Gaussian #1 308 to generate sample vectors Zsample 345. The second Diagonal Multivariate Gaussian #2, 309 is used for generating interpolation vectors for interpolation training and initialization operations of an optimization gradient search of disclosed embodiments. Using the Features Target Metrics Dataset 184, a Diagonal Multivariate Gaussian #2 309 is fitted to all of the points in latent space 307 corresponding to all of the vectors in the Features Target Metrics Dataset 184, and is used to generate sample vectors Zrandom 346.

As shown in the machine learning neural network model 300 of FIG. 3, a data input layer X 336 of the encoder 304 represents design characteristics 310 and design flow parameters 312 of the Features Target Metrics Dataset 184 with target outputs of the regression network 306 comprising target outputs Y' 318. A decoded or reconstructed output X' 348 of decoder 305 comprises reconstructed design characteristics 314 and reconstructed design flow parameters 316 (e.g., name and values). For example, the Features Target Metrics Dataset 184 of FIG. 2 is obtained from historical synthesis design construction flow files of historical IC designs. The target outputs Y' 318 of the regression network 306 includes selected targets, such as congestion, timing, and power.

In one disclosed embodiment of VAE 302 of system 200, the example neural network encoder 304 comprises two fully connected dense layers 320, 322 with a Rectified Linear Unit (ReLU) activation function. Encoder 304 comprises a plurality of nodes on the outer layer 320 (e.g., 256 nodes) and a plurality of nodes on the inner layer 322 (e.g., 128 nodes). The ReLU activation function in the neural network encoder 304 can define how a weighted sum of an input is transformed into an output of the neural network encoder. For example, the ReLU activation function of the encoder 304 can include a piecewise linear function that outputs the input directly if it is positive, or otherwise output zero. The example model encoder 304 using the ReLU activation function may be relatively easy to train to achieve effective performance of the VAE 302.

In a disclosed embodiment, an example decoder 305 of VAE 302 can be configured as the converse of the encoder 304. As shown, the decoder 305 comprises two fully connected layers 324, 326 for example with the ReLU activation function, the first plurality of nodes on the inner layer 324 (e.g., 128 nodes) and the second plurality of nodes on the outer layer 326 (e.g., 256 nodes) with a sub plurality of output nodes (e.g., 200 nodes) of the decoded output X' 348 of decoder 305 using linear activation for reconstruction.

For example, the data input layer X 336 of encoder 304 comprises a sub plurality of input nodes, such as 200 nodes including 26 nodes of design characteristics 310 and 176 nodes of design flow parameters 312. For example, the decoded output X' 348 of decoder 305 comprises a sub plurality of nodes, e.g., 200 nodes with 26 nodes of decoded design characteristics 310 and 176 nodes of decoded design flow parameters 312.

In a disclosed embodiment, the regression network 306 can include two fully connected layers 330, 332, each with 64 nodes using a Tanh activation function and 3 nodes using linear activation on the target outputs Y' 318. For example, the Tanh activation function is a hyperbolic tangent sigmoid function having a range of −1 to 1 and can model nonlinear boundaries. The Tanh activation function can be applied at different scales without losing its effectivity. In system 200, the target outputs Y' 318 of the regression network 306 can comprise congestion (weighted average congestion estimate), timing (zero-based latch to latch sum of negative slack), and total power (sum of the leakage power and dynamic power).

As shown in FIG. 3, multiple configurations of the VAE 302 are provided including separate configurations of the encoder 304, decoder 305, and the regression network 306 depending on the data flow for training, inference and optimization operations. As shown, a separate path illustrated by dotted lines provides a respective connection to a connecting point or connecting block Z 347 of the latent space 307 from Zmean 342, Zsample 345, or Zrandom 346. The block Z 347 is not a layer, block Z 347 represents a connection of the three alternative VAE configurations of Zmean 342 for inference operations, Zsample 345 for training operations, or Zrandom 346 for interpolation training and optimization operations. As shown, VAE 302 includes one of the alternative connections of Zmean 342, Zsample 345, or Zrandom 346 via connecting block Z 347 to the decoder 305 and the regression network 306.

Sampling with the first Diagonal Multivariate Gaussian #1 308 provides Zsample 345, which is used during basic training and interpolation training of VAE 302, but not during inference or optimization (i.e., the first Diagonal Multivariate Gaussian #1 is not used during optimization initialization or optimization operations). The Zsample 345 of first Diagonal Multivariate Gaussian #1 308 is centered around each one of Zmeans of the training data including some standard deviation Zstddev 344 relative to the Zmean. The output Zrandom 346 of the second Diagonal Multivariate Gaussian #2 309 is used for generating interpolation vectors and used for optimization initialization of optimization operations. The output Zrandom 346 of the second Diagonal Multivariate Gaussian #2 309 is a single distribution with a zero mean and a standard deviation equal to the root mean square of the Zmean 342 of the training data.

The VAE 302 combined with the regression network 306 are trained together (e.g., trained simultaneously) using the Features Target Metrics Dataset 184 to constrain the latent space 307 and provide a latent space representation of the dataset. The VAE 302 constrains the latent space 307 so that all training data points map near each other in the latent space 307. During basic and interpolation training of the VAE 302, the first Diagonal Multivariate Gaussian #1, 308 samples outputs Zmean 342 and Zstddev 344 of the encoder 304, providing output Zsample 345.

During training the data flow output Zmean 342 represents a mean value of encoded latent space sampled points, and the Zstddev 344 represents a variance or standard deviation value of the sampled points. The encoded data Zmean 342 and Zstddev 344 are applied to the first Diagonal Multivariate Gaussian #1, which during basic training and interpolation training of the VAE 302 provides traditional VAE sampling and the data flow output Zsample 345. Data points of the first Diagonal Multivariate Gaussian #1, 308 are applied to the decoder 305 and the regression network 306.

An example schematic illustration of first training data sample distributions in latent space 307 shown below the first Diagonal Multivariate Gaussian #1, 308 represents an example output Zsample 345 of the first Diagonal Multivariate Gaussian #1, 308. The points represent the Zmean 342 positions in latent space 307, and the curves represent the Gaussian distributions around the Zmean 342 positions with standard deviations Zstddev 344. Although only four distributions are shown, there is actually a distribution around every Zmean 342 position. We show only four for clarity. An example schematic illustration of a second training data sample distribution in latent space 307 shown above the second Diagonal Multivariate Gaussian #2, 309 represents output Zrandom 346 of the second Diagonal Multivariate Gaussian #2, 309. Both the first and second illustrations include the same training data points representing encoder output Zmean 342. Each of the training data points represents a synthesis construction flow including design characteristics 310 and design flow parameters 312 of a specific historical IC design obtained from Features Target Metrics Dataset 184.

For the first Diagonal Multivariate Gaussian #1, 308 each of the data training points has distributions in every dimension of the latent space 307, however, only the illustrated four data training distributions are shown in one dimension. In the first Diagonal Multivariate Gaussian #1, 308, each of the four training data distributions is centered around one of four Zmeans with standard deviation Zstddev relative to the respective Zmean. The illustrated training data sample distributions represent the sampling output Zsample 345 in latent space 307 of the first Diagonal Multivariate Gaussian #1, 308.

For the second Diagonal Multivariate Gaussian #2, 309, there is only one distribution in the latent space 307. The single distribution of output Zrandom 346 has multiple dimensions of the latent space 307 but the illustrated training distribution is shown in one dimension. As shown, the output Zrandom 346 of the second Diagonal Multivariate Gaussian #2, 309 is used for generating interpolation vectors for interpolation training and initialization of an optimization gradient search of optimization operations. The output Zrandom 346 is a single distribution that has a zero mean and the standard deviations for each dimension equal to the root-mean-square (RMS) of the Zmeans of the training data.

In system 200, the design characteristics 310 include design specific features that are generally static or not changed. The design characteristics 310 can comprise height and width of design placeable area; area utilization (usage over the total design placeable area); number of gates (number of instances (usages of cells); number of nets (connecting instances); and number of connections between instances (sink pins). The design characteristics 310 further comprises number of available metal layers for routing; number of routing blockages in the design; number of ports (primary input/output) in the design; placement bin density of average 1% of design; pin density of average 1% of placement pins in the design; and voltage of the design. The design characteristics 310 further comprises worst slack of latch to latch paths; number of failing timing paths; clock gating switching factor (dynamic power); system clock period; latch output switching factor (dynamic power), and the like.

The design flow parameters 312 representing design flow parameters may include sets of parameter name and value combinations. In a disclosed embodiment, the design flow parameters are converted into binary features called runids. The runids were designed to make manual parameter selection easier, and the practice was continued for automatic parameter optimization to maintain consistency. A runid is a small subset of parameters with specific values applied to them that together define a useful optimization function. This extra level of abstraction allows the function to be transparent to underlying programming changes. The inputs to the neural network are set to 1 if the corresponding runid is selected and 0 if it is not. The runids may represent logic synthesis type parameters of technology independent restructuring with values or ranges of none, down, flow, flatten, crush, destruct, choice; an adder configuration with values or ranges of ripple, fast, and fastest; and an area effort with values or ranges of 0-99. Other runids may represent placement type parameters of pin expansion factor with values or ranges of 0.0-2.0, target density with values or ranges of 30-80, and timing driven attractions of true, false. Other runids may represent clock tree synthesis, such as latch fanout, latch configuration and multiplier, each with respective values or ranges. Other runids can represent spreading type algorithms parameters. Other runids can represent global route spreading iterations with values or ranges of 0, 5, 10, 15, and 20 and pin aware density placement spreading with values or ranges of 0, 5, 10, 15, and 20. Other runids can represent late design flow optimization parameters, such as coarse opt iterations with values or ranges of 1, 2, 3, 4, fine opt iterations with values or ranges of 1, 2, 3, 4, coarse opt spreading with values or ranges of true, false, fine opt spreading with values or ranges of true, false, and extra detailed placement with values or ranges of true, false. Other runids can represent power optimization type parameters, such as low voltage (Vt) percentage with values or ranges of 0.01, 0.05, 0.10, 0.15, 0.20, 0.25, 0.30, 0.60, and area-timing margin with values or ranges of 5, 10.

System 200 can use Kendall correlation on the Features Target Metrics Dataset 184 to isolate important design flow parameters 312 for the congestion, timing, and power target outputs Y' 318 to be optimized. Hyperparameters and values 186 provide for example, a regression weight, a reconstruction weight, and an L2 regularization weight, a training data batch size, such as 256, 512, or 1024, a number of epochs, such as 15,000 epochs, and an Adam optimizer with a stepped learning rate 1e-3, 1e-4 at 25% and 95% of epochs.

Referring to FIG. 4, system 200 implements operations of an example method 400, for example, using the Features Target Metrics DataSet 184, and Hyperparameters and Values 186, with the controller 202 and parameter prediction control component 182, together with processor computer 101 of FIG. 1. In FIG. 4, the same reference numbers are used for identical or similar components of FIG. 3.

As indicated at block 402, system 200 accesses a database of historical synthesis design construction flows and receives the Features Target Metrics Dataset 184 for simultaneously training the VAE 302 and regression network 306. The Features Target Metrics Dataset 184 used for training the VAE 302 and regression network 306 comprises design characteristics 310 and design parameters 312 including sets of parameter name and value combinations (i.e., runids), and target metrics or target outputs Y' 318, as shown in FIG. 3. In addition to accessing the database of historical synthesis design construction flows to identify the dataset, system 200 can identify other data such as designer construction, regression development data, and the like to provide the dataset. At block 404, system 200 identifies a vector of features and a vector of output targets from the dataset to use for training the VAE 302 and regression network 306.

At block 406, system 200 provides or builds a machine learning neural network model 300 comprising the VAE 302 to provide dimensionality reduction combined with the combined regression network 306, to obtain a prediction of optimal design flow parameters of disclosed embodiments. FIG. 3 as described above schematically illustrates the structure of the VAE 302 and the combined regression network 306. At block 408, system 200 can perform optional basic training of the VAE 302 along with the regression network 306 using the identified vectors at block 404 to provide a training data representation of the dataset constrained to a latent space 307 of the VAE 302. System 200 can perform training of the VAE 302 along with the regression network 306 using unsupervised machine learning with a vector of training data features and supervised machine learning with a vector of training data output targets to provide the training data representation of the dataset constrained to the latent space 307 of the VAE. At block 408, the basic training can include example data flow for basic training operations 600 schematically illustrated and described with respect to FIG. 6.

Figure 7:
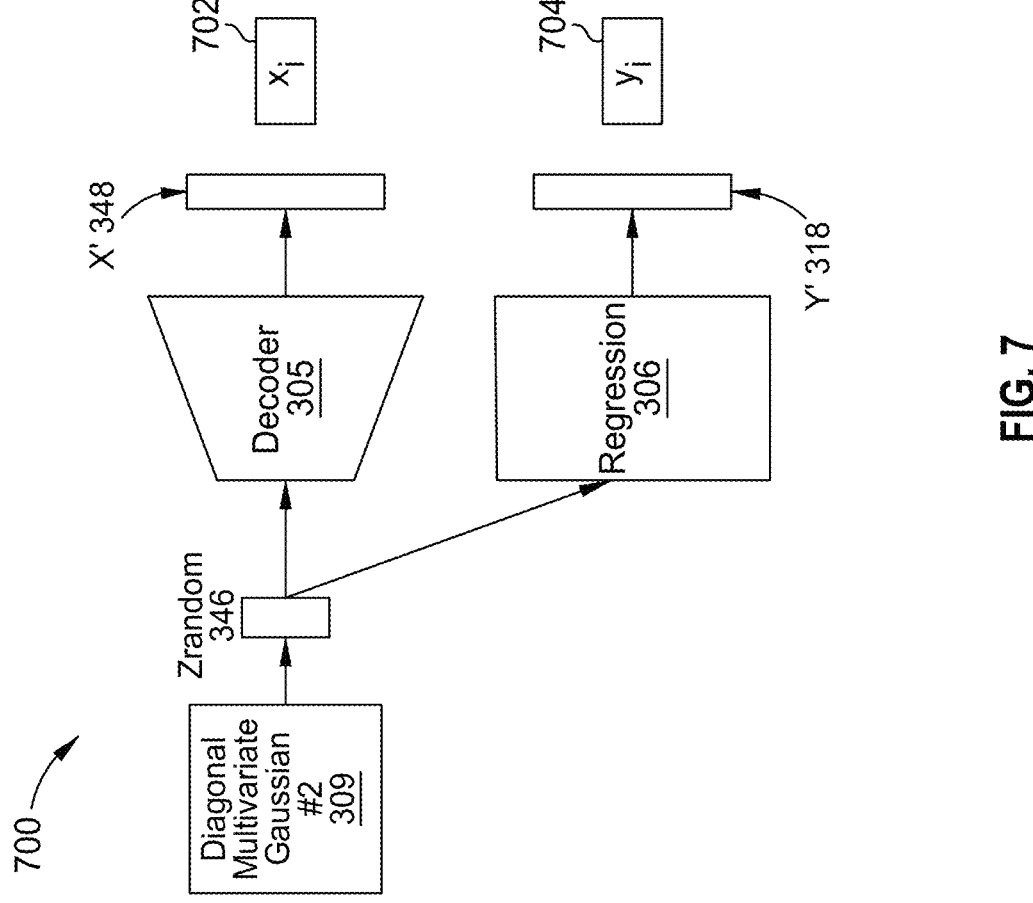
FIG. 7 schematically illustrates generating interpolated vectors for interpolation training of the VAE and combined regression network of one or more disclosed embodiments.
Figure 8:
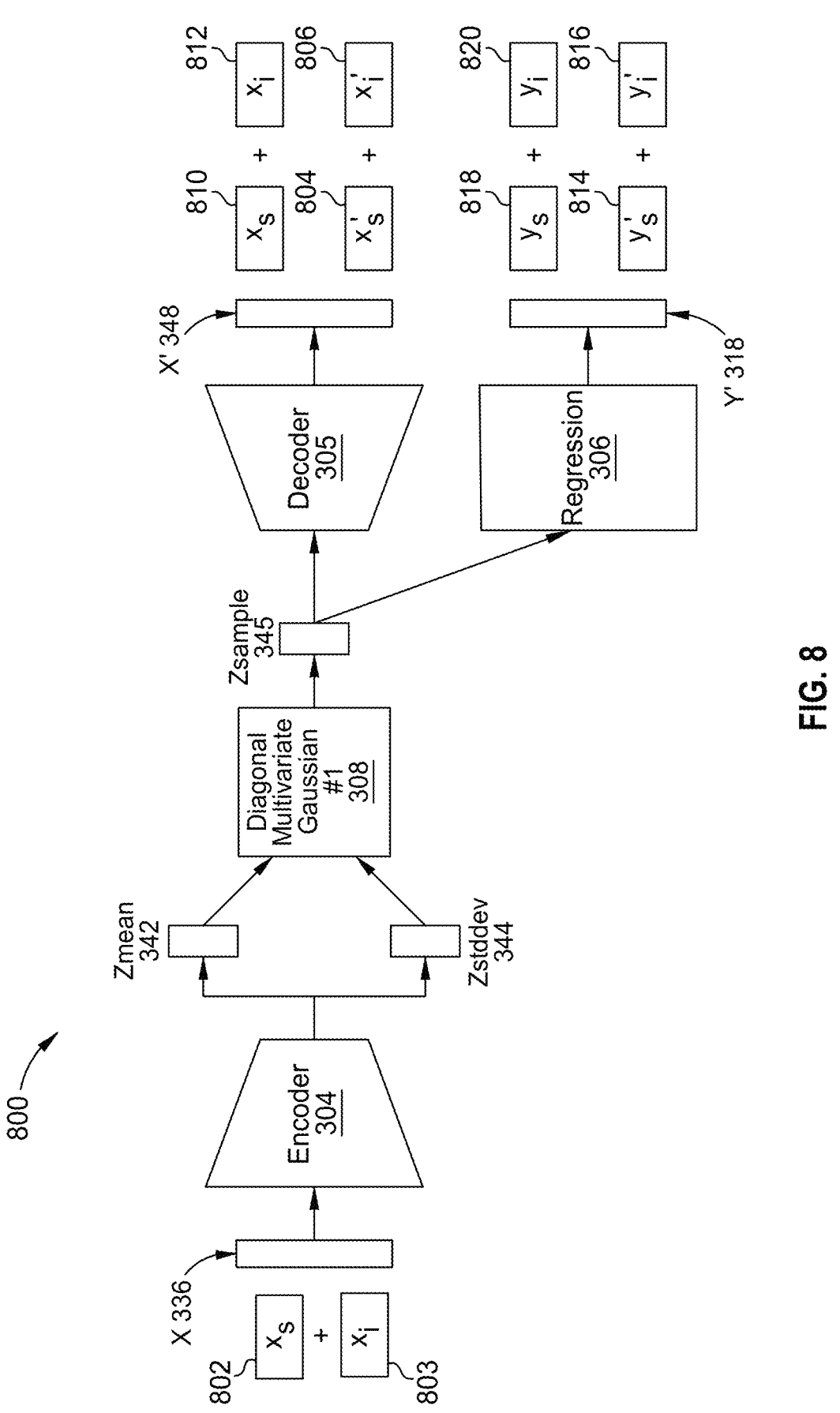
FIG. 8 schematically illustrates example interpolation training of the VAE and combined regression network of one or more disclosed embodiments.

At block 410 system 200 alternatively performs interpolation training of the VAE 302 along with the regression network 306. Note that basic training at block 408 is optional and not a prerequisite for interpolation training at block 410. In a disclosed embodiment, interpolation training can provide improved results for optimization over basic training. At block 410, system 200 can use the identified vectors at block 404 to provide a training data representation of the dataset constrained to a latent space 307 of the VAE 302. At block 410, system 200 can generate interpolated vectors by sampling the training data representation of the dataset, and running the sampled points through the decoder 305 to produce an augmented dataset each epoch used for the interpolation training operations. At block 410, the interpolation training can include the generation of interpolation vectors in a vector generation phase, such as schematically illustrated in FIG. 7 used in an interpolation training phase such as schematically illustrated in FIG. 8.

At block 410, the interpolation training provides a form of regularization. The aim of regularization it to allow the encoder 305 to generalize, which is to say interpolate. In one embodiment, additional L2 regularization on the encoder 304 can be useful.

At block 412 system 200 accesses initial design characteristics from a design construction flow for the given IC design. The design construction flow is an early construction flow after an initial placement and early optimization for the given IC design. The design construction flow is implemented before a synthesis construction flow for the given IC design. The design construction flow includes features comprising design characteristics and design flow parameters to be optimized and the output targets to be optimized (e.g., congestion, timing, and power) at the end of the construction flow. The design characteristics from the design construction flow for the given IC design are used for optimization to predict optimal design flow parameters of disclosed embodiments.

Figure 9:
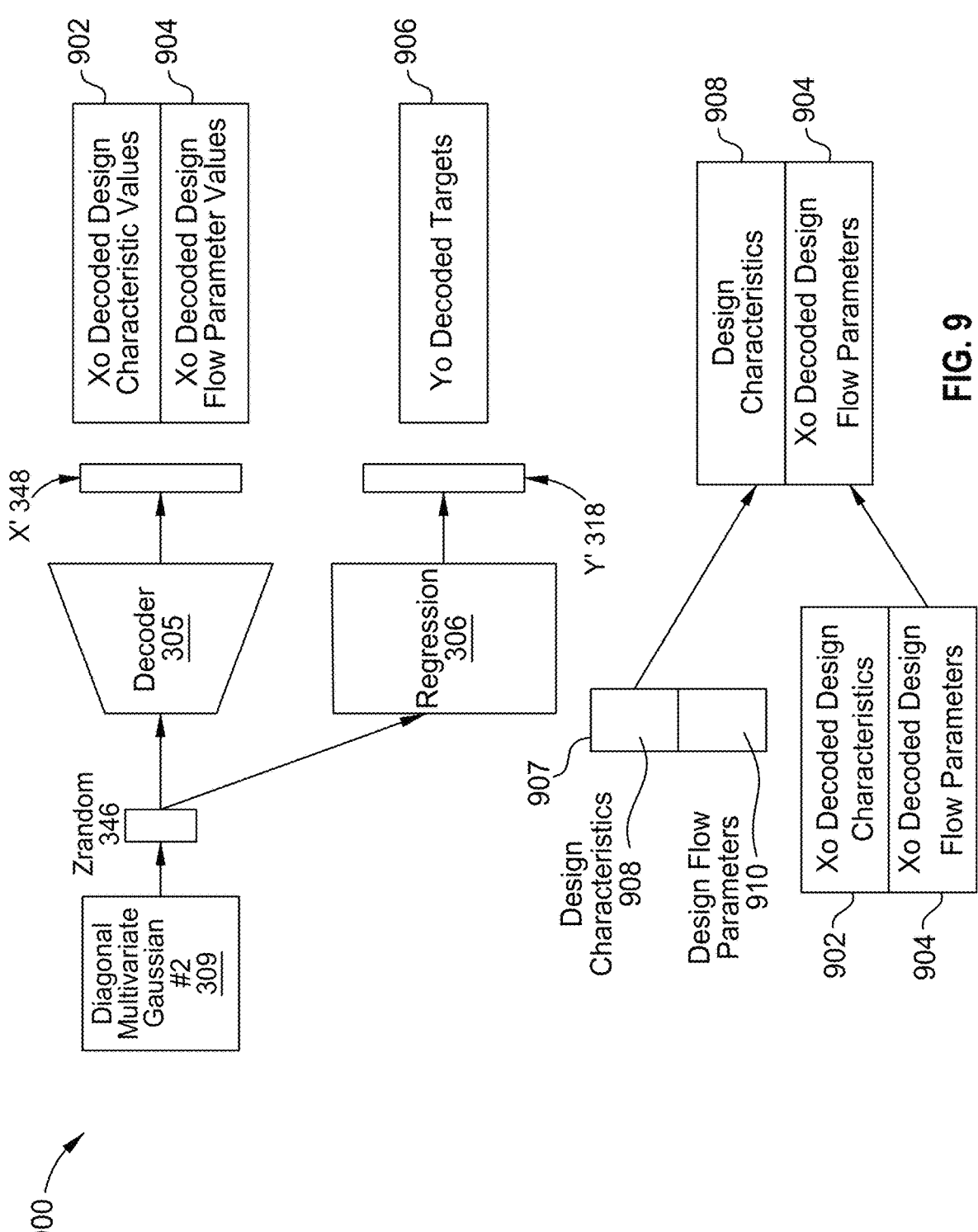
FIG. 9 schematically illustrates example initialization of an optimization gradient search of one or more disclosed embodiments.

At block 414, system 200 selects a set of random samples in the latent space 307 and decodes the random samples to generate full feature vectors comprising initial design characteristics and design flow parameters. At block 416, system 200 replaces the design characteristics in the generated feature vectors with the received initial design characteristics for the given IC design to provide an updated set of feature vectors. System 200 uses the updated set of feature vectors to perform optimization to predict optimal design flow parameters for optimized output targets for the given IC design. Operations at blocks 414 and 416 are schematically illustrated in FIG. 9.

Figure 10:
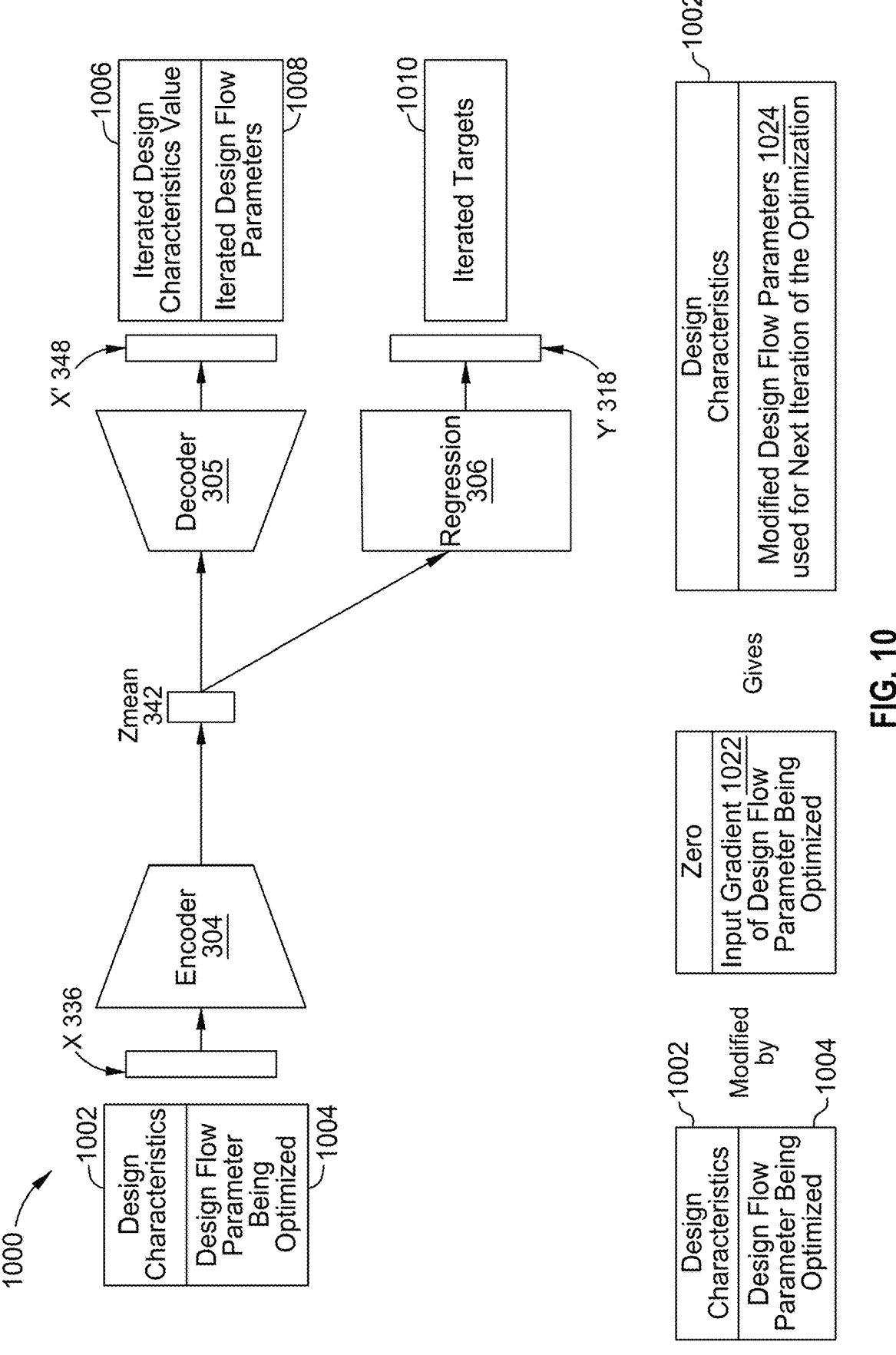
FIG. 10 schematically illustrates example optimization operations to obtain the prediction of optimal design flow parameters of one or more disclosed embodiments.
Figure 11:
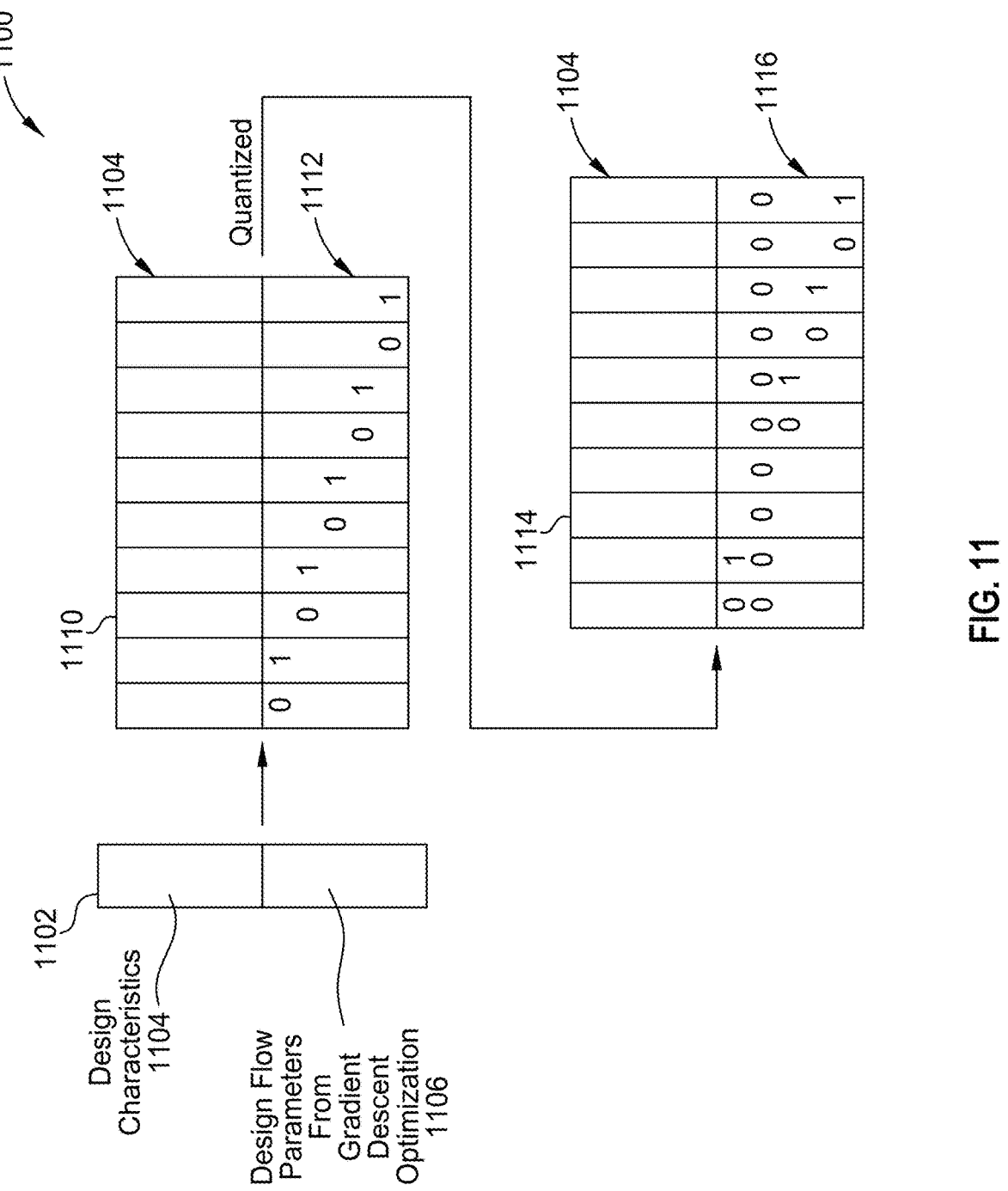
FIG. 11 schematically illustrates example optimization operations for fine-tuning of optimal design flow parameters of one or more disclosed embodiments.

At block 418, system 200 performs an input gradient descent search of the updated set of feature vectors from the training data representation of the dataset constrained to the initial design characteristics to optimize an objective function of the design targets to identify locally optimal design parameters. For example, system 200 optimizes the objective function of the output targets with relative weights of importance with restriction to keep the optimization within the latent space defined by the training data and enable the reliable prediction of the locally optimal design parameters. In a disclosed embodiment, weights of importance are assigned to contributions to the objective function for example including congestion, timing, and power, and a wander component and reconstruction error. During the input gradient descent search, the initial design characteristics remain fixed, with a restriction to keep the optimization within the latent space defined by the training data, to generate reliable recommended design parameters. Operations at block 418 for example are schematically illustrated in FIG. 10. In one embodiment, at block 422 system 200 sorts the locally optimal design parameters based on the objective function for the design targets to identify a globally optimum of the locally optimal design parameters for optimized output targets. At block 424 system 200 optionally performs threshold quantization of the globally optimum design parameters. Alternatively, at block 426 system 200 optionally performs fine-tuning of the globally optimum design parameters. Operations at block 426 for example are schematically illustrated in FIG. 11. At block 428 system 200 obtains the prediction of the optimized output targets based on the globally optimum design parameters.

Figure 5:
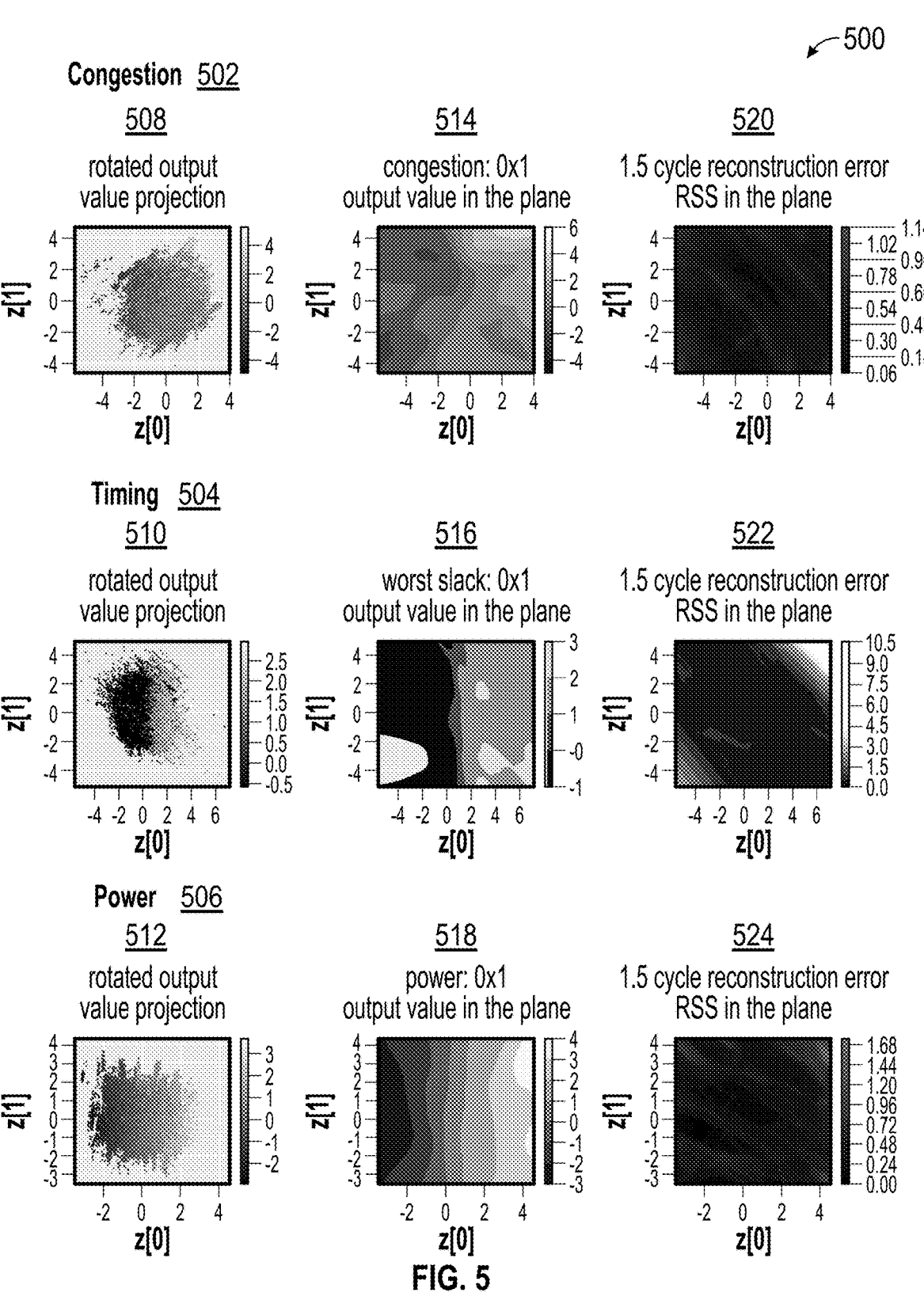
FIG. 5 illustrates examples images of two dimensions of latent space for congestion, timing and power output targets of one or more disclosed embodiments.

FIG. 5 illustrates example projected latent space sample images 500 for each output target including congestion 502, timing 504, and power 506 of one or more disclosed embodiments. The examples images 500 include two dimensions of latent space for each output target, whereas the latent space 307 includes for example, 35 dimensions. A respective first image 508, 510, and 512 for congestion 502, timing 504, and power 506 illustrates the latent space projected and rotated image where each dot or data point represents a physical synthesis job of design characteristics and parameter/values from the Features Target Metrics Dataset 184. In the congestion image 508, the right-side shading legend represents a scale approximately from about −4 to +4 for an illustrated vertical axis $Z(1)$, horizontal axis $Z(0)$ rotated projection of a scaled and normalized congestion output value. In the timing image 510, the right-side shading legend represents a scale approximately from about −0.5 to +2.5 for an illustrated vertical axis $Z(1)$, horizontal axis $Z(0)$ rotated projection of a scaled and normalized timing output value. In the power image 510, the right-side shading legend represents a scale approximately from about −3 to +3 for an illustrated vertical axis $Z(1)$, horizontal axis $Z(0)$ rotated projection of a scaled and normalized power output value.

A respective second image 514, 516, and 518 that respectively show how the value of the output target congestion 502, timing 504, and power 506 changes in a latent space plane. Each of the respective images 514, 516, and 518 shows a different plane, because the principal axes are different for congestion 502, timing 504, and power 506. A respective third image 520, 522, 524 respectively illustrate a reconstruction error in the plane of the axes for an illustrated vertical axis Z(1), horizontal axis Z(0). The respective right-side shading legends represents upwardly increasing error starting at zero (0). The respective third image 520, 522, 524 can show where valid features are located. Low error values of images 520, 522, 524 indicates good reconstruction; high error indicates that the features mapping to that area of latent space are not reliable for parameter prediction.

Figure 6:
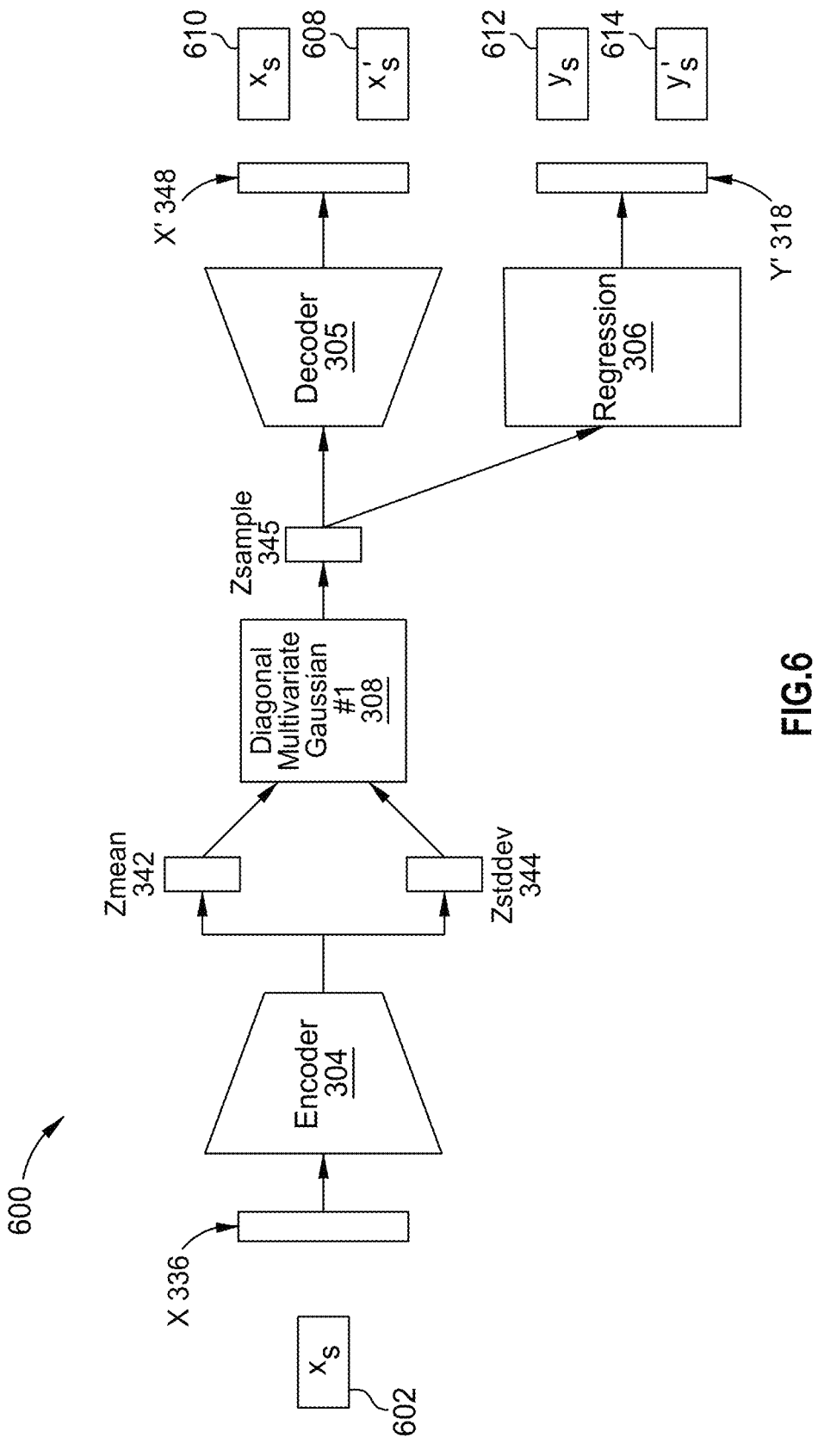
FIG. 6 schematically illustrates example data flow training steps of the VAE and combined regression network of one or more disclosed embodiments.

FIG. 6 schematically illustrates example data flow for basic training operations 600 of the VAE 302 and combined regression network 306 of disclosed embodiments. In one embodiment, system 200 trains the VAE 302 combined with the regression network 306 to constrain the latent space 307 and provide a latent space representation of the Features Target Metrics Dataset 184.

In a disclosed embodiment, system 200 identifies a vector of features (Xs) and a vector of output targets (Ys) from the Features Target Metrics Dataset 184 to train the VAE 302 and combined regression network 306 of one or more disclosed embodiments. For example, the vector of features Xs comprising design characteristics 310 and design flow parameters 312. The input layer X 336 of encoder 304 receives a vector of features data input 602 Xs. The output X' 346 of decoder 305 provides a vector of decoded or reconstructed features 608 X's. The outputs Y' 318 of the regression network 306 provides a vector of predicted output targets 614 Y's. In a disclosed embodiment, system 200 computes a reconstruction error, which is a measure of the difference between the reconstructed features 608 X's and 610 Xs, where 610 Xs is the same data as the vector of features data input 602 Xs; and computes a regression error, which is a measure of the difference between actual targets 612 Ys and the predicted output targets 614 Y's. System 200 performs basic training of the VAE 302 and the combined regression network 306 together using forward propagation of the training vector of features data input 602 Xs and backwards propagation to minimize the Kullbeck-Leibler divergence and the mean squared error between training data points of the reconstruction and the regression.

Basic training occurs with multiple epochs. Each epoch represents the flow of the dataset once through the machine learning neural network model 300 with an updating of the neural network weights and biases, although usually the dataset is broken up into batches with updates occurring for each batch. The basic training comprises encoding by the encoder 304 providing Zmean 342 and Zstddev 344 to the first Diagonal Multivariate Gaussian #1, 308, which provides Zsample 345, which is input to the decoder 305 and the regression network 306. Zsample 345 is decoded by the decoder 305 providing a vector of the reconstructed features 608 X's. The outputs Y' 318 of the regression network 306 provides a vector of predicted output targets 614 Y's.

During the training operations 600, the KL divergence loss term pushes each sampling distribution toward a multivariate Gaussian distribution with zero mean and unit variance. For each dimension of the latent space 307, these distributions tend to one of two stable states. The first state distributes the sample means over the latent space 307 with small variances that tend toward zero. Although the sample distribution can overlap during the early epochs of the training operations 600, the overlap diminishes during later epochs of training.

The second state can move all of the sample means toward zero and all of the sample variances to one. When the sample means move to or near zero, the dimension can no longer encode any information about the features, and that that dimension of latent space is called collapsed. An interesting behavior for the collapse of latent space dimensions is that if the latent space 307 is defined with more dimensions than the VAE uses to encode the features, the extra dimensions collapse. The number of collapsed dimensions can be counted and the latent space 307 reduced accordingly. To determine whether a dimension has collapsed, the mean of the variances is compared to the variance of the means. When the mean of the variances is larger, this can determine that the dimension has collapsed. In order to keep the latent space 307 from collapsing entirely, the effective KL weight can be tuned indirectly and the reconstruction weight can be adjusted, where collapse of the latent space for example, is caused by a too high KL weight or too low reconstruction weight.

Referring to FIGS. 7 and 8, example operations of VAE 302 and the combined regression network 306 of one or more disclosed embodiments for generating interpolation vectors each epoch are schematically illustrated in FIG. 7 and performing interpolation training each epoch using the interpolation vectors are shown in FIG. 8.

In FIG. 7, the example operations 700 to generate a set of interpolated vectors include selecting a random set of points in latent space every epoch and using the decoder 305 of the VAE 302 to reconstruct vectors for random set of points. The output Zrandom 346 of second Diagonal Multivariate Gaussian #2, 309 is used for generating interpolation vectors. As shown, the latent space vector Zrandom 346 is applied to the decoder 305 and the regression network 306. The reconstructed output layer 348 X' of decoder 305 provides the generated interpolation vectors 702 Xi. The regression target outputs Y' 318 of the regression network 306 provides the corresponding output targets.

FIG. 8 schematically illustrates example interpolation training operations 800 for interpolation training of the VAE 302 and the combined regression network 306 using the interpolation vectors generated each epoch in FIG. 7. In one embodiment, system 200 performs interpolation training to improve the reliability of the prediction or recommendations for design flow parameters to be optimized and reduce regression error. In FIG. 8, sampling with the first Diagonal Multivariate Gaussian #1 308 provides Zsample 345 is used for interpolation training of VAE 302, (e.g., the same data flow path as used for the basic training of FIG. 6).

In FIG. 8, the interpolation training operations 800 starts with a dataset training vector training vector 802 Xs and output targets vector 818 Ys of regression network 306. In interpolation training operations 800, the interpolated vectors 803 Xi generated by the VAE 302 at each epoch are combined with the training vector 802 Xs (e.g., concatenated together) and the interpolated vectors 820 Yi at each epoch are combined with the output targets vector 818 Ys. In a disclosed embodiment, system 200 computes a reconstruction error based on the difference between the combined training vector 810 Xs and interpolated vectors 812 Xi and the combined reconstructed vector 804 X's and reconstructed interpolated 806 X'i. In a disclosed embodiment, system 200 computes a regression error, which is a measure of the difference between the combined actual target vector 818 Ys and interpolated vectors 820 Yi and the combined predicted output targets vector 814 Y's and interpolated vector 816 Y'i. The combined training vector 802 Xs and interpolated vectors 803 Xi and the regression output targets vector 818 Ys and interpolated vector 816 Yi produce an augmented dataset each epoch as indicated by the combined reconstructed vector 804 X's and 806 X'i and output target vector 814 Y' and 816 Y'. The augmented dataset is dynamic and produced by using the VAE 302 and regression network 306 under training.

Referring to FIGS. 9 and 10, system 200 uses the VAE 302 and the combined regression network 306 for schematically illustrated example initialization operations 900 for an optimization input gradient search in FIG. 9 and for optimization operations 1000 including iterated optimization input gradient searches of FIG. 10 of disclosed embodiments.

In FIG. 9, system 200 obtains a set of random samples in the latent space 307 from the Zrandom 346 of second Diagonal Multivariate Gaussian #2, 309 for the example initialization operations 900. The output Zrandom 346 is processed by decoder 305 and the regression network 306. The decoded output X' 348 comprising decoded design characteristic values Xo 902 and decoded design flow parameters Xo 904. The regression network target outputs Y' 318 comprises decoded targets Yo 906. System 200 obtains an input 907 comprising initial design characteristics 908 and design flow parameters 910 to be optimized for the prediction of optimal design flow parameters for physical design synthesis construction flow for the given IC design, and the decoded design characteristic values Xo 902 and decoded design flow parameters Xo 904. The system 200 merges the input 907 initial design characteristics 908 and the decoded design flow parameters Xo 904 of the decoder 305, to use for a next iteration of the optimization gradient searches of FIG. 10.

FIG. 10 schematically illustrates example optimization operations 1000 to obtain the prediction of optimal design flow parameters for optimized output targets of one or more disclosed embodiments. In a disclosed embodiment as illustrated in FIG. 10, optimization is performed using the initial design characteristics 1002 (initial design characteristics 908 of FIG. 9), and modified design flow parameters 1024 for multiple iterations of the optimization operations. System 200 iteratively performs an input gradient search, of a set of latent space samples constrained to the initial design characteristics 1002 to optimize an objective function of the design targets with relative weights of importance to identify locally optimal design parameters for optimal design targets. In a disclosed embodiment, weights of importance are assigned to contributions to the objective function for example including congestion, timing, and power; a reconstruction error; and a wander component to keep the optimization within the latent space defined by the training data and enable the reliable prediction of the locally optimal design parameters.

In a disclosed embodiment, system 200 receive a data input design characteristics 1002 comprising initial design characteristics 1002 implemented for physical design flow synthesis of a given IC design and design flow parameters 1004 being optimized, (e.g., decoded design flow parameters Xo 904 of the decoder 305 of FIG. 9 for the input Zrandom 346). The encoder 304 encodes the initial design characteristics 1002 and design flow parameters 1004 providing encoder output Zmean 342 to the decoder 305 and regression network 306. The output X' 348 of decoder 305 provides iterated design characteristics values 1006 and iterated design flow parameters 1008 for each iteration of the optimization. The target outputs Y' 318 of regression network 306 provide iterated targets 1010. As shown, the initial design characteristics 1002 are not changed (modified by zero) and the design flow parameters 1004 being optimized are modified by an input gradient 1022. The modified design flow parameters 1024 provided by the modification and the same initial design characteristics 1002 are used for a next iteration of the optimization operations.

FIG. 11 schematically illustrates example fine-tuning operations 1100 of optimal design flow parameters of one or more disclosed embodiments. An input 1102 or fine-tuning comprise design characteristics 1104 and design flow parameter values 1006 provided from gradient descent optimization. A set of vectors 1110 of multiple single vectors comprising the design characteristics 1104 that remain unchanged, and design flow parameters 1112 including some parameter features that are not quantized (e.g., some binary features of optimal design parameters 1106) that should be quantized to zero or one. For each binary parameter features to be quantized (e.g., five binary parameter features shown in steps with 0 1), are quantized fixing one feature at a time. As shown, quantized design flow parameters 1114 include the same design characteristics 1104 and binary parameter features 1116 to be quantized for example with value 0 of the second parameter to be fixed. For all the binary features, a zero or one is tried, and the objective function for each of vectors is calculated with each parameter block or slice. The parameter values are flipped for zero or one, to identify the best parameter value (e.g., 0 or 1) based on the objective function. Quantizing feature values continues until all of the binary features are quantized to the best parameter value zero and one.

While the foregoing is directed to embodiments of the present invention, other and further embodiments of the invention may be devised without departing from the basic scope thereof, and the scope thereof is determined by the claims that follow.

What is claimed is:

1. A method comprising:
   receiving initial design characteristics, design flow parameters, and design targets from a design construction flow for a given integrated circuit (IC) design;
   receiving a historical dataset comprising synthesis design construction flows from historical IC designs;
   training a Variational Autoencoder (VAE) along with a regression network using the historical dataset to provide a training data representation of the dataset constrained to a latent space of the VAE;
   generating feature vectors based on the training data representation of the dataset and updating the feature vectors with the initial design characteristics;
   iteratively performing an input gradient search of the updated feature vectors to optimize an objective function of the design targets to identify locally optimal design parameters, wherein the training data samples are constrained to the initial design characteristics; and
   obtaining a prediction of global optimal design flow parameters based on the identified locally optimal design parameters for optimized design targets.

2. The method of claim 1, further comprises decoding a random set of samples from the training data representation of the dataset to generate feature vectors comprising design characteristics and design flow parameters; and wherein updating the feature vectors with the initial design characteristics comprises replacing design characteristics in the generated feature vectors with the initial design characteristics to provide the updated feature vectors.

3. The method of claim 1, wherein iteratively performing the input gradient search further comprises calculating an input gradient for each optimization epoch, applying the input gradient to modify next design flow parameters for a next optimization iteration.

4. The method of claim 1, wherein obtaining the prediction of global optimal design flow parameters based on the locally optimal design parameters for the optimized design targets further comprises performing quantization of at least one binary parameter element of the global optimal design flow parameters.

5. The method of claim 1, further comprises building the VAE comprising an encoder, the latent space, and a decoder; and wherein the encoder comprises one or more neural network layers with a first plurality nodes on an inner layer and a second plurality of nodes on outer layer; wherein the decoder comprises one or more neural network layers with the second plurality of nodes on a decoder inner layer and the first plurality nodes on a decoder outer layer and wherein the latent space comprises a random sample layer comprising multiple nodes.

6. The method of claim 1, wherein obtaining the prediction of global optimal design flow parameters based on the identified locally optimal design parameters for the optimized design targets further comprises sorting the locally optimal design parameters based on the objective function to identify the global optimal design flow parameters.

7. The method of claim 1, wherein training the VAE along with the regression network further comprises performing interpolation training of the VAE along with the regression network using combined interpolated vectors and training vectors to minimize a reconstruction error of the training data representation of the dataset.

8. The method of claim 1, wherein training the VAE along with the regression network further comprises performing training of the VAE along with the regression network using unsupervised machine learning with a vector of training data features and supervised machine learning with a vector of training data output targets to provide the training data representation of the dataset constrained to the latent space of the VAE.

9. The method of claim 1, wherein training the VAE along with the regression network further comprises generating interpolated vectors of the dataset, and combining the interpolated vectors with training vectors to produce an augmented dataset each epoch.

10. The method of claim 1, wherein iteratively performing the input gradient search further comprises using hyperparameter values comprising at least one of a regression weight, a reconstruction weight, a number of epochs for training or a training batch size.

11. The method of claim 1, wherein the regression network is connected to a neural network layer of the VAE that represents the latent space.

12. A system, comprising:
a processor; and
a memory, wherein the memory includes a computer program product configured to perform operations for predicting optimal design flow parameters for physical design synthesis of a given integrated circuit (IC) design, the operations comprising:
receiving initial design characteristics, design flow parameters, and design targets from a design construction flow for the given integrated circuit (IC) design;
receiving a historical dataset comprising synthesis design construction flows from historical IC designs;
training a Variational Autoencoder (VAE) along with a regression network using the historical dataset to provide a training data representation of the dataset constrained to a latent space of the VAE;

generating feature vectors based on the training data representation of the dataset and updating the feature vectors with the initial design characteristics;
iteratively performing an input gradient search of the updated feature vectors to optimize an objective function of the design targets to identify locally optimal design parameters, wherein the training data samples are constrained to the initial design characteristics; and
obtaining a prediction of global optimal design flow parameters based on the identified locally optimal design parameters for optimized design targets.

13. The system of claim 12, further comprises decoding a random set of samples from the training data representation of the dataset to generate feature vectors comprising design characteristics and design flow parameters; and wherein updating the feature vectors with the initial design characteristics comprises replacing design characteristics in the generated feature vectors with the initial design characteristics to provide the updated feature vectors.

14. The system of claim 12, wherein training the VAE along with the regression network further comprises performing training of the VAE along with the regression network using unsupervised machine learning with a vector of training data features and supervised machine learning with a vector of training data output targets to provide the training data representation of the dataset constrained to the latent space of the VAE.

15. The system of claim 12, wherein iteratively performing the input gradient search further comprises calculating an input gradient for each optimization epoch, applying the input gradient to modify next design flow parameters for a next optimization epoch.

16. The system of claim 12, wherein obtaining the prediction of global optimal design flow parameters further comprises performing quantization of at least one binary parameter element of global optimal design flow parameters.

17. A computer program product for implementing prediction of optimal design flow parameters for physical design synthesis of a given integrated circuit (IC) design, the computer program product comprising:
a computer-readable storage medium having computer-readable program code embodied therewith, the computer-readable program code executable by one or more computer processors to perform an operation comprising:
receiving initial design characteristics, design flow parameters, and design targets from a design construction flow for a given integrated circuit (IC) design;
receiving a historical dataset comprising synthesis design construction flows from historical IC designs;
training a Variational Autoencoder (VAE) along with a regression network using the historical dataset to provide a training data representation of the dataset constrained to a latent space of the VAE;
generating feature vectors based on the training data representation of the dataset and updating the feature vectors with the initial design characteristics;
iteratively performing an input gradient search of the updated feature vectors to optimize an objective function of the design targets to identify locally optimal design parameters, wherein the training data samples are constrained to the initial design characteristics; and
obtaining a prediction of global optimal design flow parameters based on the identified locally optimal design parameters for optimized design targets.

18. The computer program product of claim 17, further comprises sorting the locally optimal design parameters based the objective function to obtain the prediction of globally optimal design flow parameters for the given IC design.

19. The computer program product of claim 17, wherein training the VAE along with the regression network further comprises generating interpolated vectors of the dataset, and combining the interpolated vectors with training vectors to produce an augmented dataset each epoch.

20. The computer program product of claim 17, wherein training the VAE along with the regression network further comprises performing training of the VAE along with the regression network using unsupervised machine learning with a vector of training data features and supervised machine learning with a vector of training data output targets to provide the training data representation of the dataset constrained to the latent space of the VAE.

21. The computer program product of claim 16, further comprises decoding a random set of samples from the training data representation of the dataset to generate the feature vectors comprising design characteristics and design flow parameters; and wherein updating the feature vectors with the initial design characteristics comprises replacing design characteristics in the generated feature vectors with the initial design characteristics to provide the updated feature vectors.

\* \* \* \* \*